(12) United States Patent
Kusko et al.

(10) Patent No.: US 8,095,837 B2
(45) Date of Patent: Jan. 10, 2012

(54) METHOD AND APPARATUS FOR IMPROVING RANDOM PATTERN TESTING OF LOGIC STRUCTURES

(75) Inventors: Mary P. Kusko, Hopewell Junction, NY (US); Barry W. Krumm, Poughkeepsie, NY (US); Patrick Meaney, Poughkeepsie, NY (US); Bryan J. Robbins, Beavercreek, OH (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/051,744

(22) Filed: Mar. 19, 2008

(65) Prior Publication Data
US 2009/0240995 A1 Sep. 24, 2009

(51) Int. Cl.
*G01R 31/28* (2006.01)
(52) U.S. Cl. .................................................. 714/726
(58) Field of Classification Search .................. 714/726, 714/727, 729
See application file for complete search history.

(56) References Cited

U.S. PATENT DOCUMENTS

| | | | |
|---|---|---|---|
| 5,229,999 A | 7/1993 | Cushing et al. | |
| 5,260,949 A * | 11/1993 | Hashizume et al. | 714/731 |
| 5,323,400 A * | 6/1994 | Agarwal et al. | 714/728 |
| 5,349,587 A * | 9/1994 | Nadeau-Dostie et al. | 714/729 |
| 5,745,500 A | 4/1998 | Damarla et al. | |
| 5,983,380 A * | 11/1999 | Motika et al. | 714/733 |
| 6,061,818 A * | 5/2000 | Touba et al. | 714/739 |
| 6,148,425 A * | 11/2000 | Bhawmik et al. | 714/726 |
| 6,836,865 B2 * | 12/2004 | Kusko et al. | 714/726 |
| 6,968,427 B1 * | 11/2005 | Yee | 711/118 |
| 7,146,551 B2 * | 12/2006 | Ghisiawan et al. | 714/726 |
| 7,580,807 B2 * | 8/2009 | Bullock et al. | 702/117 |
| 2006/0112320 A1 | 5/2006 | Balakrishnan et al. | |

* cited by examiner

*Primary Examiner* — James C Kerveros
(74) *Attorney, Agent, or Firm* — Cantor Colburn LLP; John Campbell

(57) ABSTRACT

A test method and apparatus for randomly testing logic structures. The method includes identifying and analyzing a functional behavior of a logic structure to be covered during the random testing, modifying the logic structure such that the logic structure behaves in a functional manner during random testing, and generating patterns to exercise the modified logic structure.

18 Claims, 16 Drawing Sheets

METHOD AND APPARATUS FOR IMPROVING RANDOM PATTERN TESTING OF LOGIC STRUCTURES

BACKGROUND OF THE INVENTION

This invention relates generally to a method and apparatus for improving random pattern testing of logic structures, and more particularly to providing a test method and apparatus for random data testing of a logic structure in a functional manner.

Several existing test methods for random data testing of integrated circuits (ICs) are performed to detect defects or faulty circuit behavior, to thereby maintain proper functional operation of the ICs. One existing test method is a pseudo-random test method which is a built-in self test (BIST) including part of the internal circuitry in the IC and generating test patterns. The pseudo-random test method includes generating test patterns by initializing latches with random values and after a desired clock sequence, compressing the resulting latch values into a signature register or unloading the resulting latch values into observable registers or primary outputs (POs). In generating pseudo random patterns using the existing method, fault coverage is a typical metric utilized. The existing pseudo-random test method targets 100% fault coverage and some other existing methods have been employed which target less than 100% or n-detect where each detection is achieved via a different path. FIG. 1 shows a conventional configuration for random pattern testing. In FIG. 1, random data is generated by a random data source 1 and are shifted into multiple scan chains 2 using scan in (SI) ports. Test responses corresponding to the scan chains 2 are then collected in a signature register 4. FIGS. 2 and 3 are block diagrams illustrating a pre-disclosed method for enhancing random pattern test. Here, conventional scan chains are utilized for testing multiple registers and their downstream logic in a circuit under test.

FIG. 2 illustrates a conventional scan chain 10 having a master register 15 and a shadow register 20 located immediately downstream from the master register 15. In random data testing, randomly generated data bits from a pseudo-random pattern generator (not shown) are serially loaded into latches within the master register 15 and the shadow register 20. Data bits intended to be stored in the shadow register 20 first pass through the master register 15. Once the test data is generated and loaded into the registers 15 and 20, the data is used to test a logic circuit such as a comparator 25, for example. The comparator 25 compares each data bit in the master register 15 with a corresponding data bit in the shadow register 20. If the data bits match then the output 30 of the comparator will be equal to one. On the other hand, if the data bits do not match, then the output 30 is equal to zero. Further, a bitflip logic unit 50 and an associated weight logic 55 are provided for randomly inverting a bit sent through a parallel data path 40. The weight programmed into the weight logic 55 determines the likelihood of a given bit being flipped by the bitflip logic unit 50. Therefore, when it is desired to test the comparator 25 with a near match condition, a select mechanism 60 is activated to switch the source of the data to the shadow register 20 from the output data path 35 to the parallel data path 40, based on a value of an input control signal 45. The parallel data path 40 is routed through the bitflip logic unit 50, and the weight logic 55 is enabled. If no bit flipping is desired the bitflip logic unit 50 and the weight logic 55 are disabled and the data passes directly through the parallel data path 40 and into the shadow register 20. FIG. 3 illustrates conventional scan chains 100a and 100b having a master register 110 and multiple shadow registers 120a and 120b. Shadow registers 120a and 120b each have an associated select mechanism 140a and 140b and a bitflip logic unit including a weight logic 150a and 150b, respectively. The select mechanisms 140a and 140b are respectively activated to switch the source of the data to the shadow registers 140a and 140b, based on a value of input control signals 160a and 160b, respectively. A comparator 158 compares the data bits between the master register 110 and either the shadow register 120a or the shadow register 120b based upon a selection made by a select mechanism 155. There are several disadvantages associated with existing test methods, for example, linear dependencies occur with multiple registers being fed from a same random source when not in a special test mode. Another disadvantage is associated with the late mode timing paths of a circuit. Typically, the most critical late mode timing paths are difficult to test, and therefore a random test environment may not be implemented.

It would be desirable to be able to randomly test the logic structure in a functional manner. Further, it would be desirable to be able to modify a circuit configuration such that a critical late mode timing path will be more frequently tested during a pseudo-random test method.

BRIEF SUMMARY OF THE INVENTION

An exemplary embodiment includes a test method for randomly testing logic structures. The method includes identifying and analyzing a functional behavior of a logic structure to be covered during the random testing, modifying the logic structure such that the logic structure behaves in a functional manner during random testing, and generating patterns to exercise the modified logic structure.

Another exemplary embodiment includes a method for providing improved random testing of critical late mode timing paths. This method includes identifying and analyzing the timing critical paths, modifying the logic structure such that the timing critical paths are frequently exercised and generating the test patterns to exercise the modified logic structure.

Another exemplary embodiment includes a method for providing improved random pattern testing of a logic structure including a plurality of registers. The method includes routing a parallel data path between plurality of registers, configuring data manipulation logic within the parallel data path to be shared between the plurality of registers and configuring a plurality of select mechanisms corresponding to each of the plurality of registers, to select a scan chain from which random data is to be sourced to the respective register.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Technical benefits of the present invention include enabling random testing of logic structures in a functional manner and enabling modification of a logic circuit configuration such that a critical late mode timing path may be more frequently tested during a pseudo-random test method.

Figure 1:
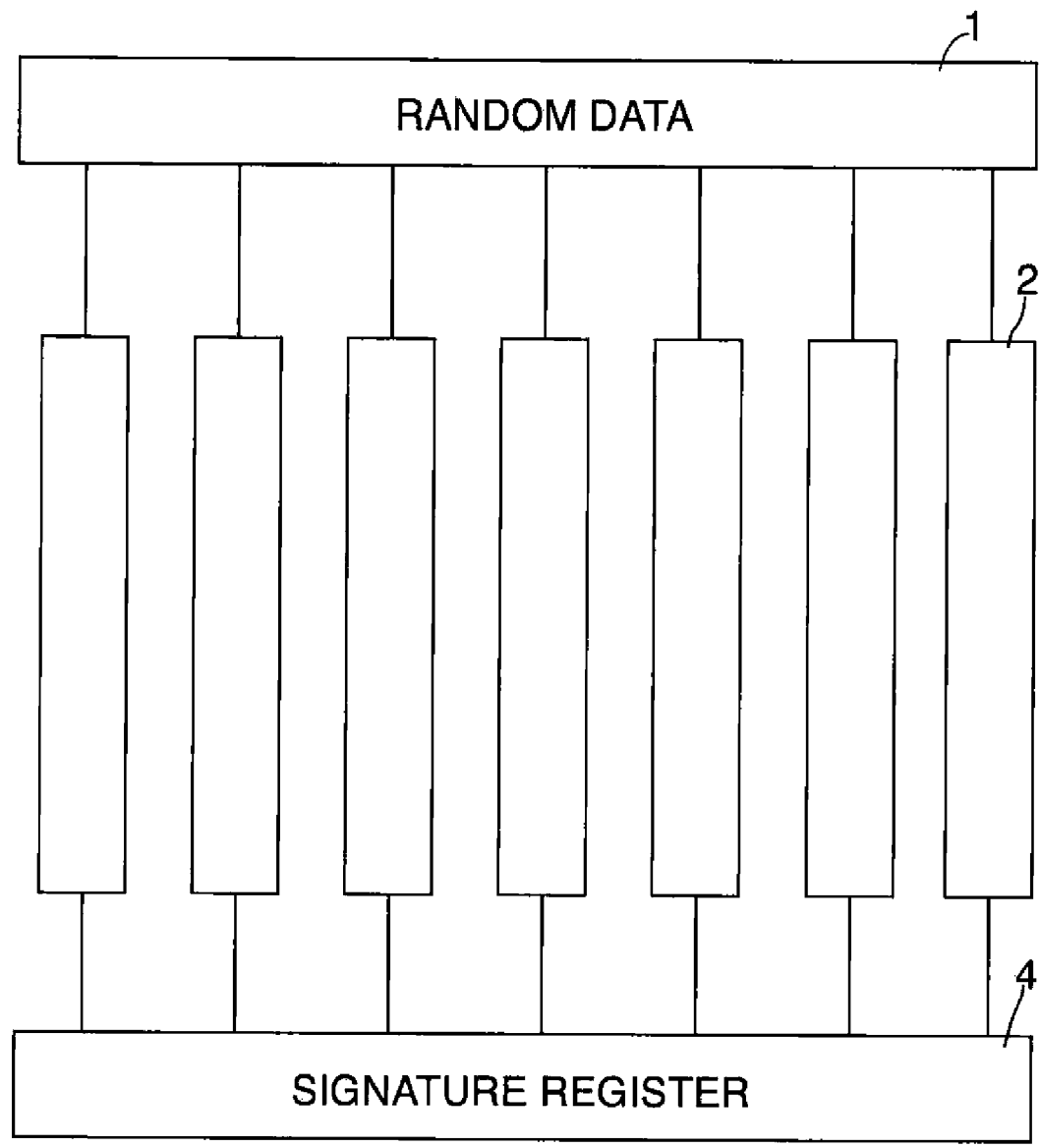
FIG. 1 is a block diagram illustrating a conventional configuration for random pattern testing.
Figure 2:
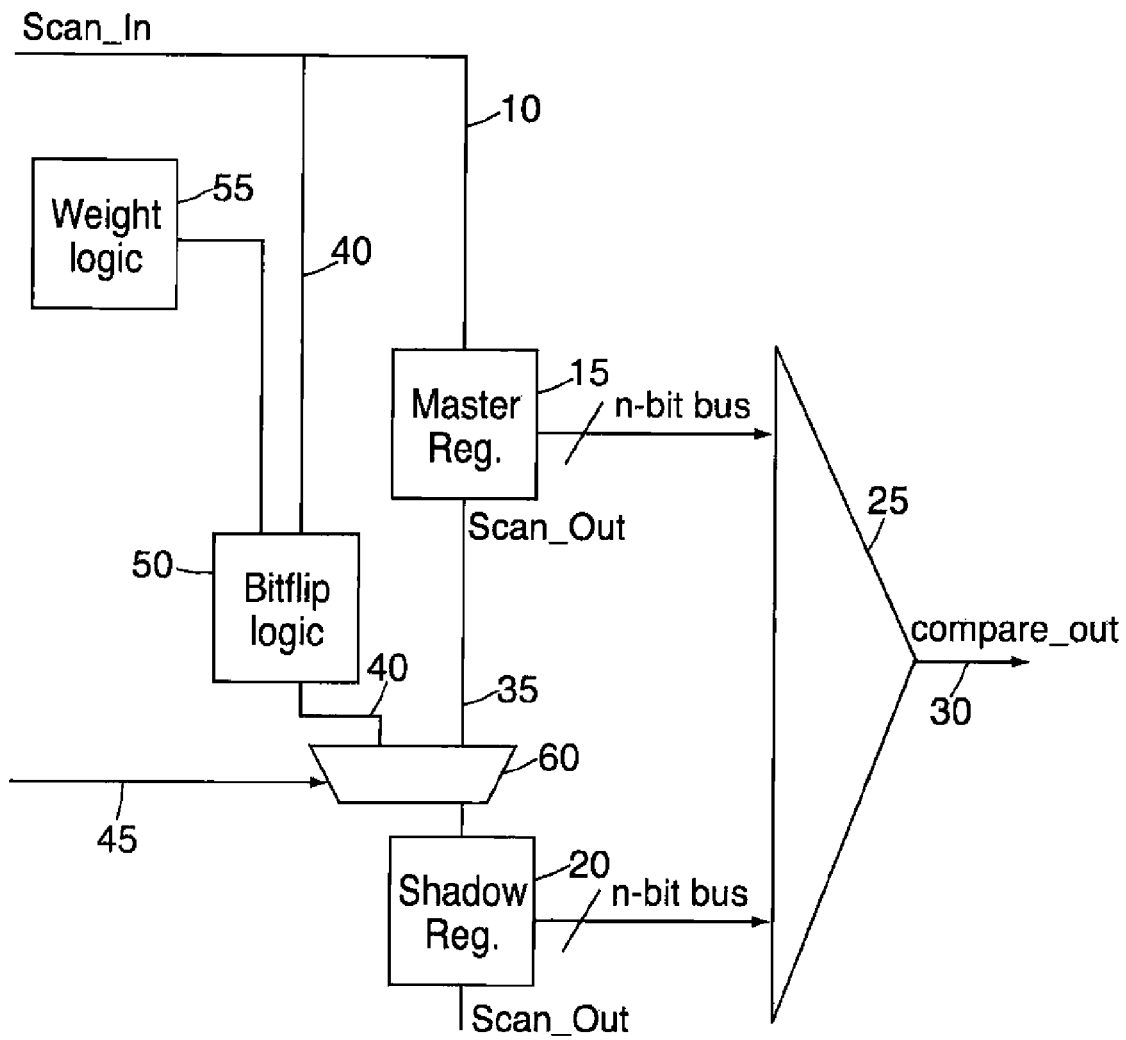
FIG. 2 is a block diagram illustrating a conventional scan chain having multiple registers for storing test data to be utilized by a logic circuit under test.
Figure 3:
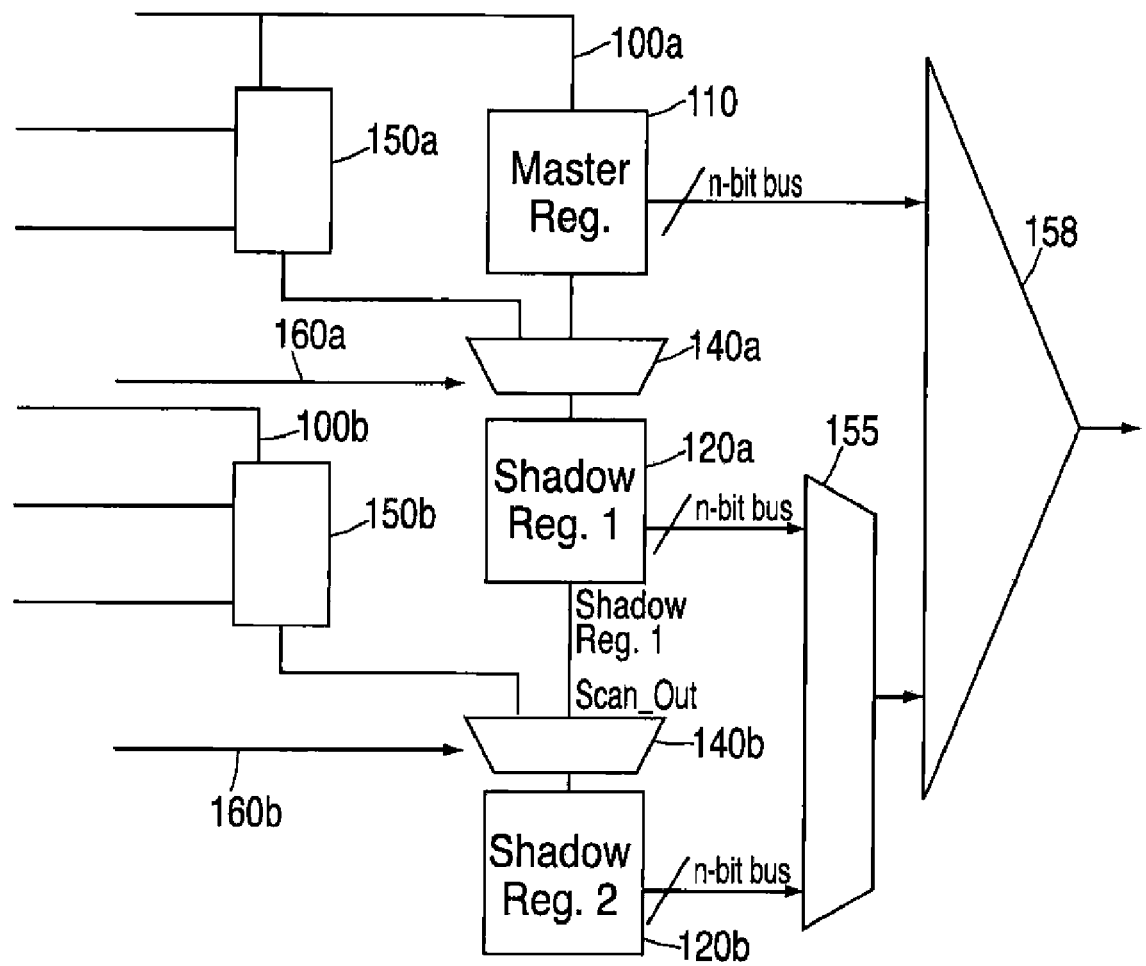
FIG. 3 is a block diagram illustrating conventional scan chains having multiple registers for storing test data to be utilized by a logic circuit under test.
Figure 4:
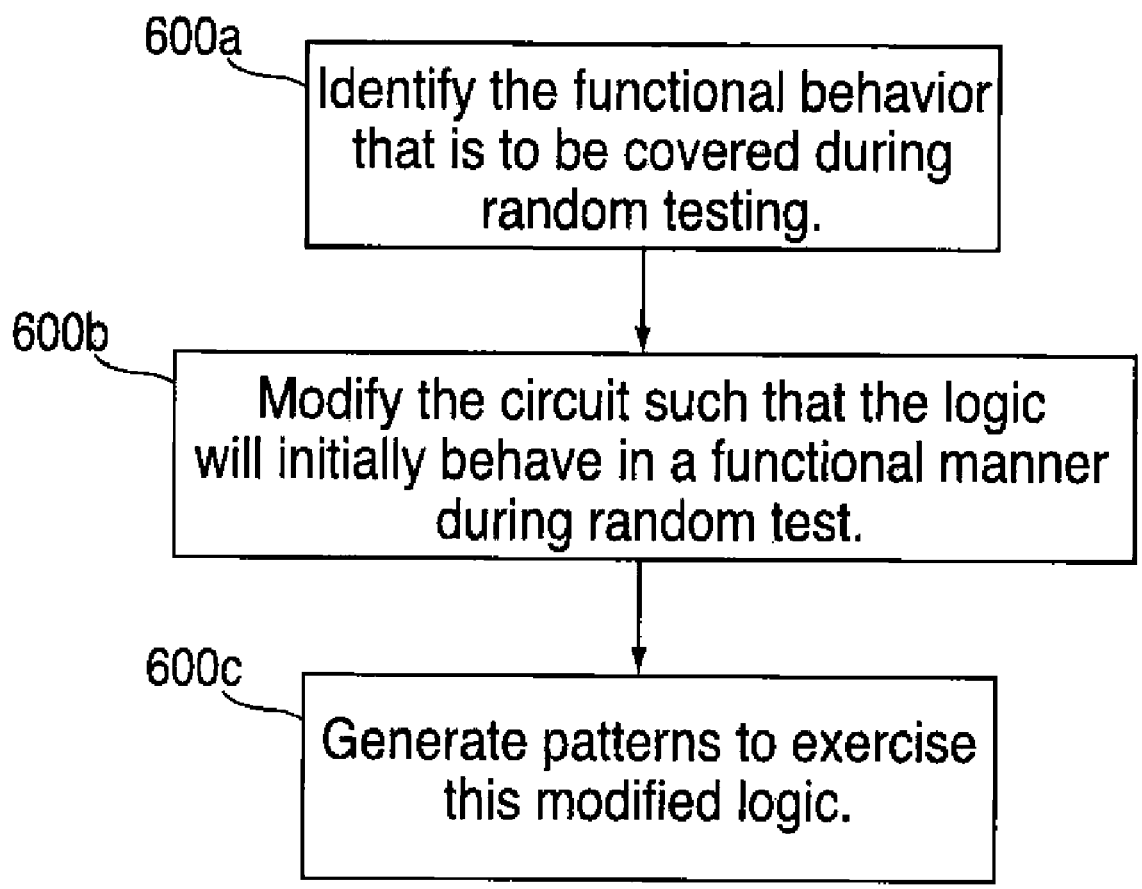
FIG. 4 is a flowchart illustrating a method for randomly testing logic structures in a functional manner that can be implemented within embodiments of the present invention.

FIG. 4 is a flowchart illustrating a method for randomly testing a logic structure in a functional manner. As shown in FIG. 4, the method begins at operation 600a where a functional behavior of the logic circuit to be covered during random testing is identified and analyzed. The process then moves to operation 600b, where the logic circuit is modified such that the logic circuit initially behaves in a functional manner during random testing thereof. The process then moves to operation 600c, wherein patterns are generated to exercise the modified logic circuit.

According to an exemplary embodiment, operation 600b may further include modifying the logic structure by manipulating the scan data so the behavior equates to that of a typical functional behavior. This includes but is not limited to forcing scan data to certain values or setting up a relational behavior between groups of latches.

According to an exemplary embodiment, operation 600b may further include modifying the logic structure by forcing noncritical logic to non-controlling states with respect to targeted paths of the logic structure. In addition, according to an exemplary embodiment, the paths are critical timing paths where a late timing mode timing slack is less than a predetermined margin. Further, the critical timing paths include a path from launching a latch through a longest combinatorial logic to a final latching point.

According to an exemplary embodiment, operation 600b may further include setting latches (to be discussed later) during a scan portion of the random test. In addition, the latches may be set such that noncritical paths of critical OR gates are set to a value of zero. Alternatively, the latches may be set such that noncritical paths of critical AND gates are set to a value of one.

Figure 5:
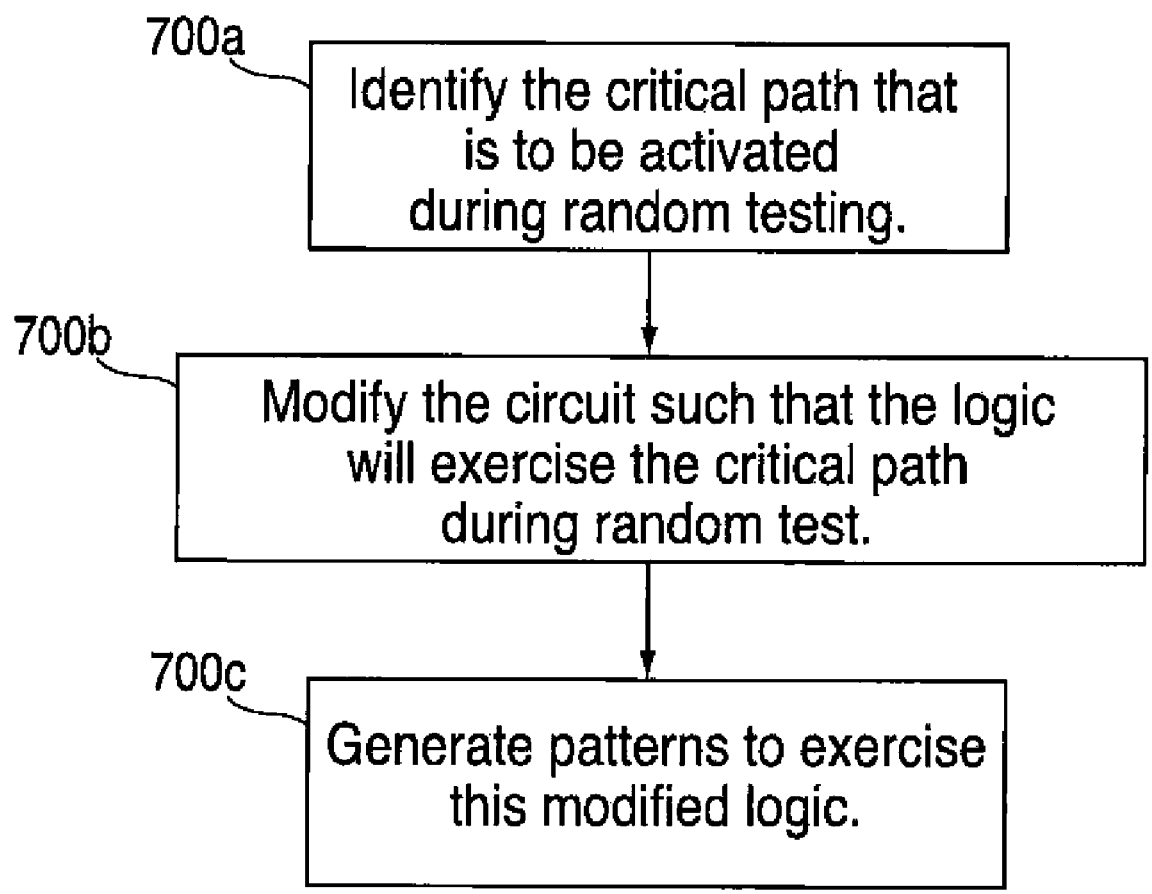
FIG. 5 is a flowchart illustrating an operation for timing critical paths of the method shown in FIG. 4 that can be implemented within embodiments of the present invention.

FIG. 5 is a flowchart illustrating an operation for timing critical paths within a logic structure. As shown in FIG. 5, at operation 700a, a critical path of a logic circuit to be activated during random testing is identified and analyzed. From operation 700a, the process moves to operation 700b, where the logic circuit is modified such that the logic thereof exercises a critical path during random testing. From operation 700b, the process moves to operation 700c where patterns are generated to exercise the modified logic circuit.

According to an exemplary embodiment, operation 700b may further include modifying the logic structure by manipulating the scan data so the behavior equates to that of a typical functional behavior. This includes but is not limited to forcing scan data to certain values or setting up a relational behavior between groups of latches.

FIGS. 6A, 6B and 6C and 6D are block diagrams illustrating testing schemes for devices under test that can be implemented within embodiments of the present invention.

Figure 6A:
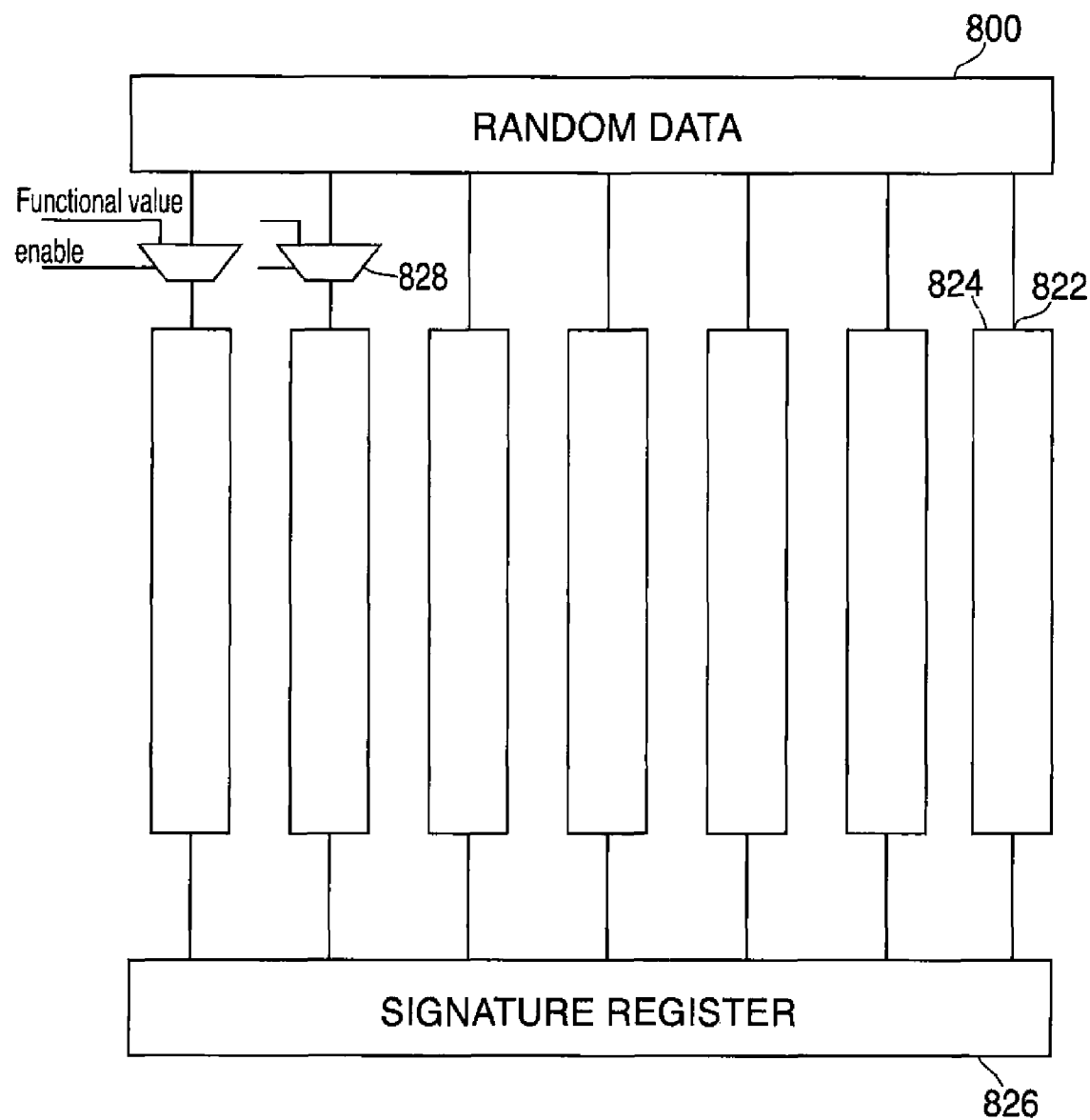
FIGS. 6A, 6B, 6C and 6D are block diagrams illustrating testing schemes that can be implemented within embodiments of the present invention.
Figure 6B:
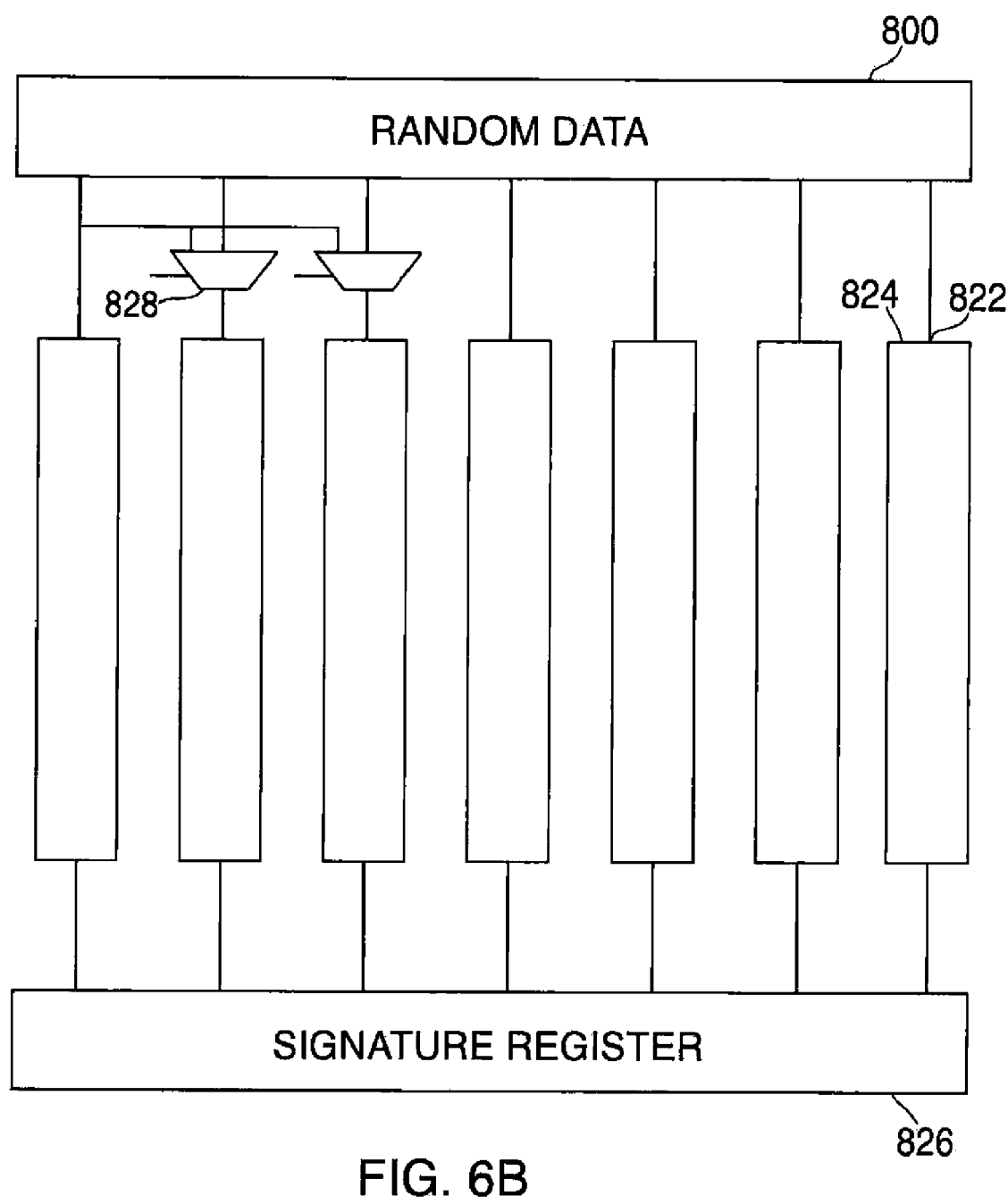
Figure 6C:
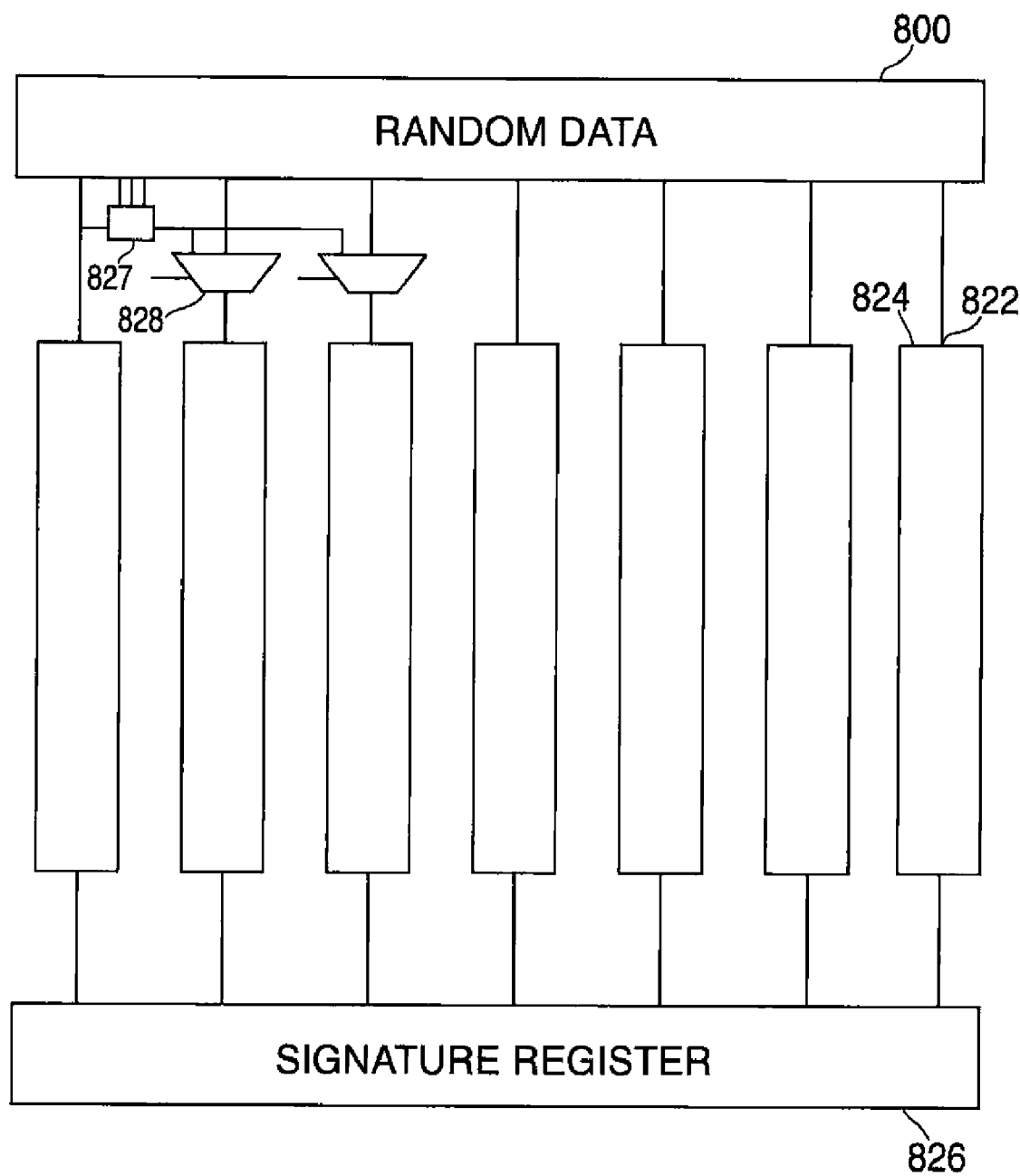
Figure 6D:
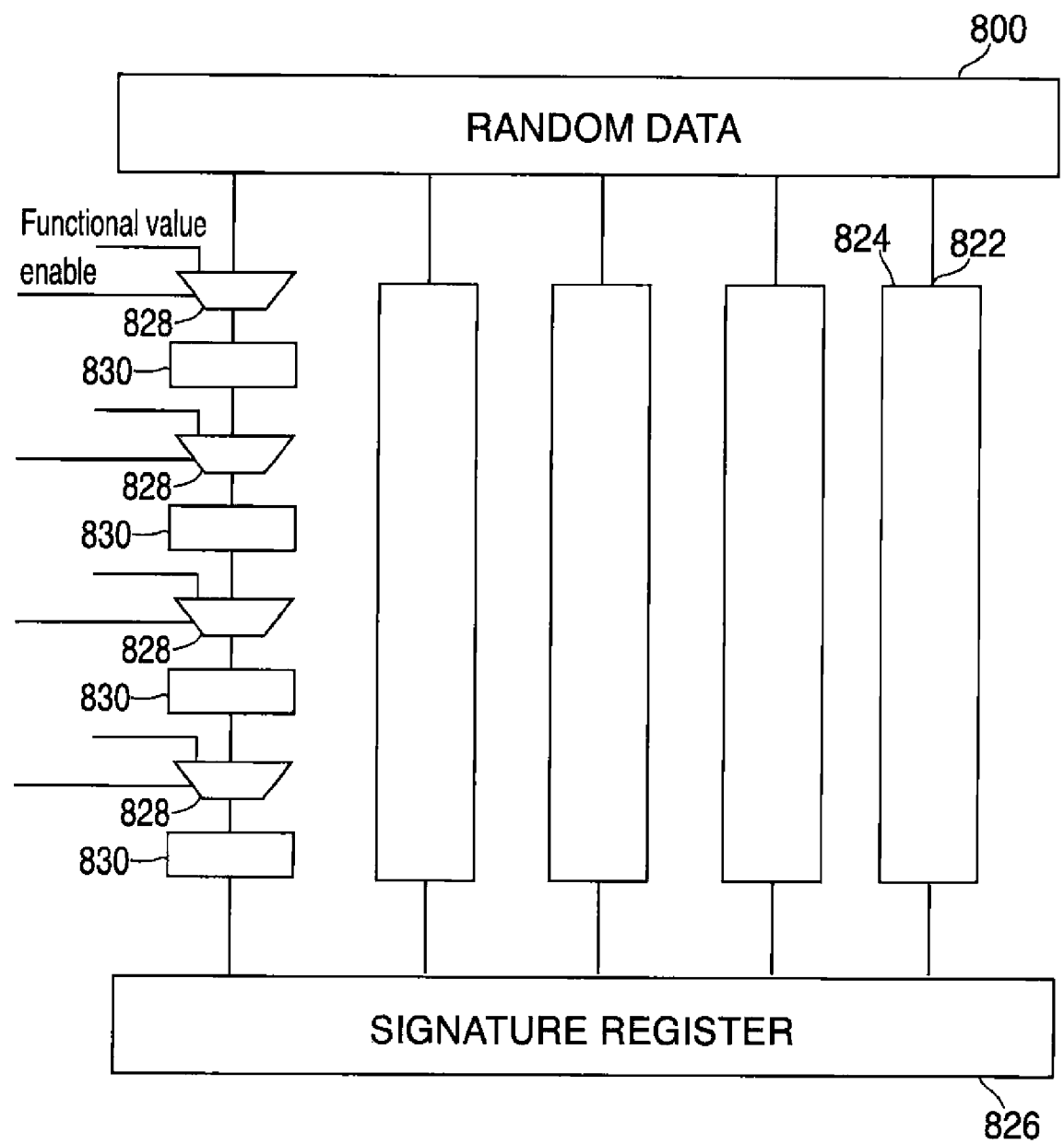

As shown in FIG. 6A, random data is generated by a random data source 800 and are shifted into multiple scan chains 824 using scan in (SI) ports 822. An independent functional value is being input into a select mechanism 828. Test responses corresponding to the scan chains 824 are then collected in a signature register 826 or a primary output (PO), for example. FIGS. 6B and 6C and 6D illustrate some of the same features as those of FIG. 6A, therefore, the same reference numerals have been used and detailed description of the corresponding features has been omitted. Although only two scan chains are illustrated in FIG. 6A, the number of scan chains may vary, as necessary.

As shown in FIG. 6B, according to the current exemplary embodiment, three of the scan chains 824 receive the same random data when selected. Alternatively, according to an exemplary embodiment of the present invention, each of the scan chains 824 may receive the same random data from the random data source 800. However, some of the scan chains 824 may be bit flipped by a respective bitflip logic unit 827 (see FIG. 6C), when necessary. Although only two channels are configured, the number of channels may vary, as necessary.

As shown in FIG. 6C, according to a current exemplary embodiment of the present invention, the scan chains 824 share the same bit logic unit 827.

As shown in FIG. 6D, according to the current exemplary embodiment, individual latches 830 in a scan chain may receive non-random data. The data is loaded in parallel in one cycle to the latches 830 after old data has been scanned out of the latches 830. Although all latches are shown receiving non-random data, the number of latches so controlled may vary, as necessary.

Figure 7:
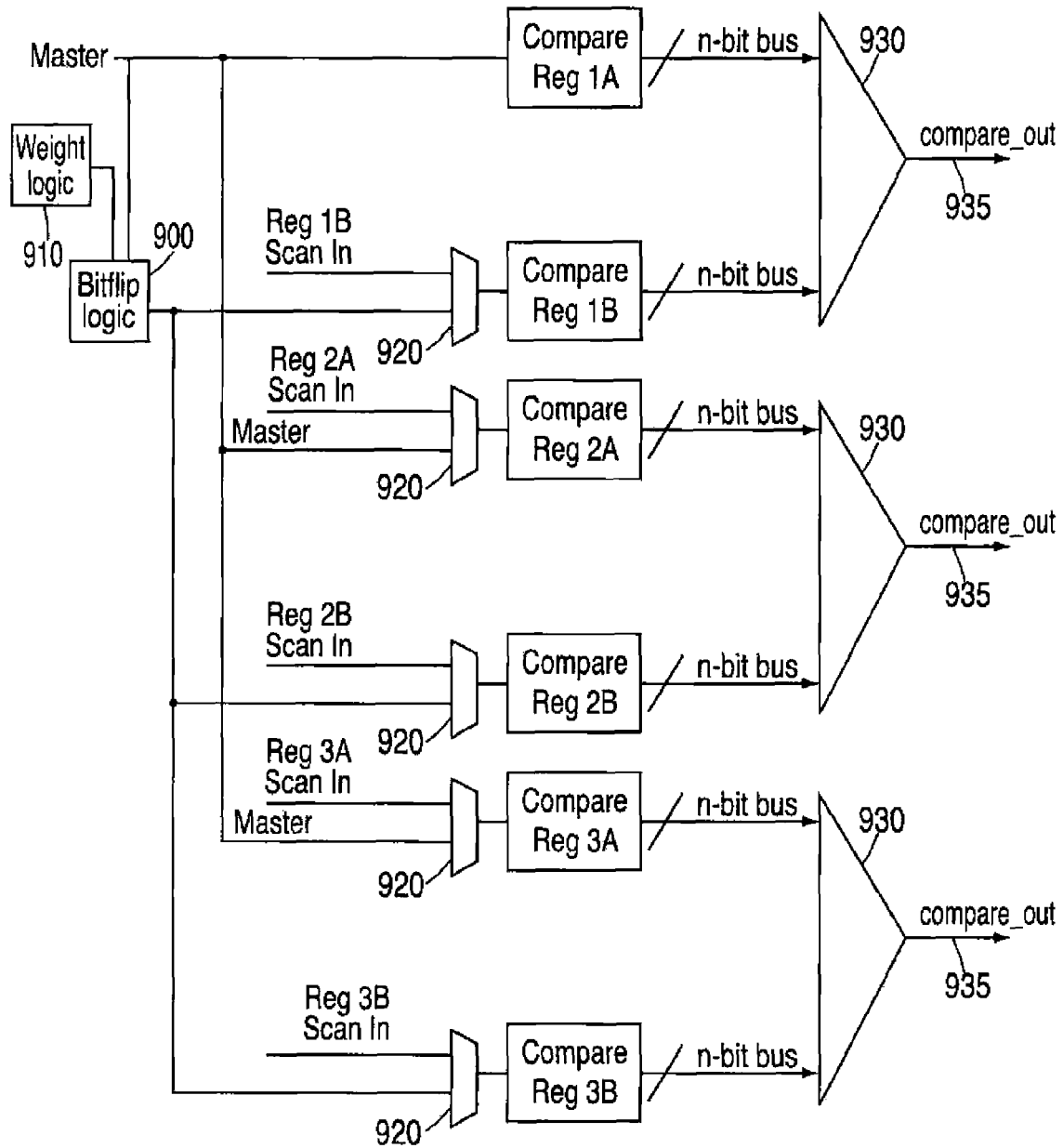
FIG. 7 is a block diagram illustrating a scan chain having multiple compare registers sharing a single bitflip logic unit that can be implemented within embodiments of the present invention.

FIG. 7 is a block diagram illustrating a plurality of scan chains having a plurality of compare registers sharing a single bitflip logic unit that can be implemented within embodiments of the present invention. As shown in FIG. 7, a plurality of compare registers 1A, 1B, 2A, 2B, 3A and 3B share a single bitflip logic unit 900 and an associated weight logic 910. Each of compare register 1A, 1B, 2A, 2B, 3A and 3B includes a separate scan in Scan In Reg 1B, Scan In Reg 2A, Scan In Reg 2B, Scan In Reg 3A, Scan in Reg 3B and is also coupled to a master scan chain MASTER via a respective select mechanism 920. The data bits for each of compare registers 1A, 1B, 2A, 2B, 3A and 3B are compared via a respective comparator 930 and an output 935 of the comparator 930 is then determined. The data sourced to compare registers 1B, 2B and 3B may be bit flipped via the single bitflip logic unit 900, when necessary.

Figure 8:
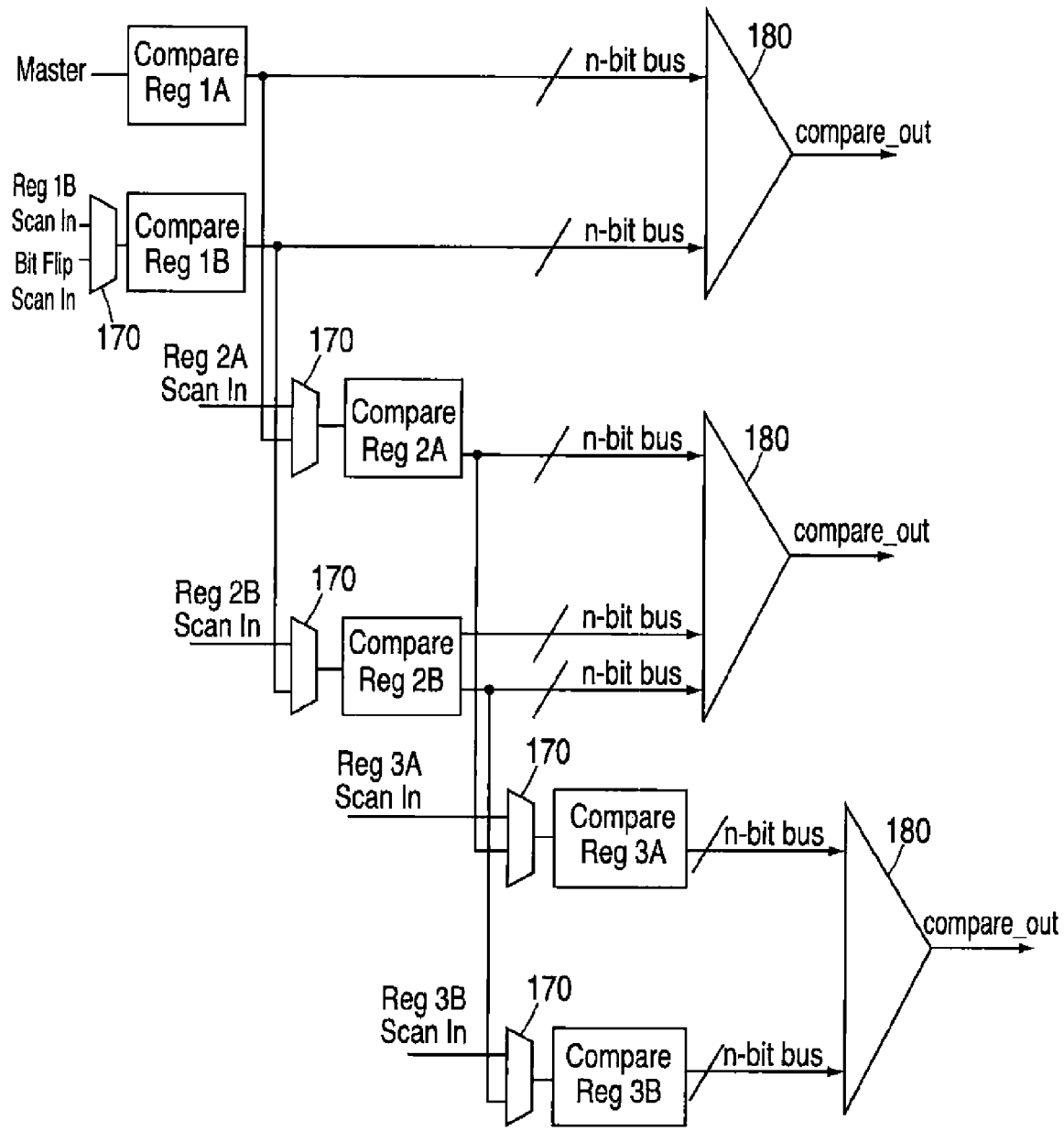
FIG. 8 is a block diagram illustrating a scan chain having a concatenation of multiple compare registers that can be implemented within embodiments of the present invention.

FIG. 8 is a block diagram illustrating a plurality of scan chains and a concatenation of compare registers. As shown in FIG. 8, a master scan chain MASTER is associated with compare register 1A and the output side of the compare register 1A is coupled to an input side of a select mechanism 170 associated with the compare register 2A and the output side of the compare register 1B is coupled to the input side of the select mechanism 170 of the compare register 2B. Further, the output of the compare register 2A is coupled to an input of the select mechanism 170 associated with the compare register 3A and the output of the compare register 2B is coupled to the input of the select mechanism 170 associated with the compare register 3B. Each of the compare registers 1B, 2A, 2B, 3A and 3B also include a separate scan chain Scan In Reg 1B, Reg 2A, Reg 2B, Reg 3A and Reg 3B. Data bits from compare register 1A are compared to those of compare register 1B via a respective comparator 180, and the data bits from the compare register 2A are compared to those of the compare register 2B via a comparator 180, and the data bits from the compare register 3A are compared to those of the compare register 3B via a comparator 180. The random data sourced may also be bit flipped via a bitflip logic unit (not shown).

Figure 9A:
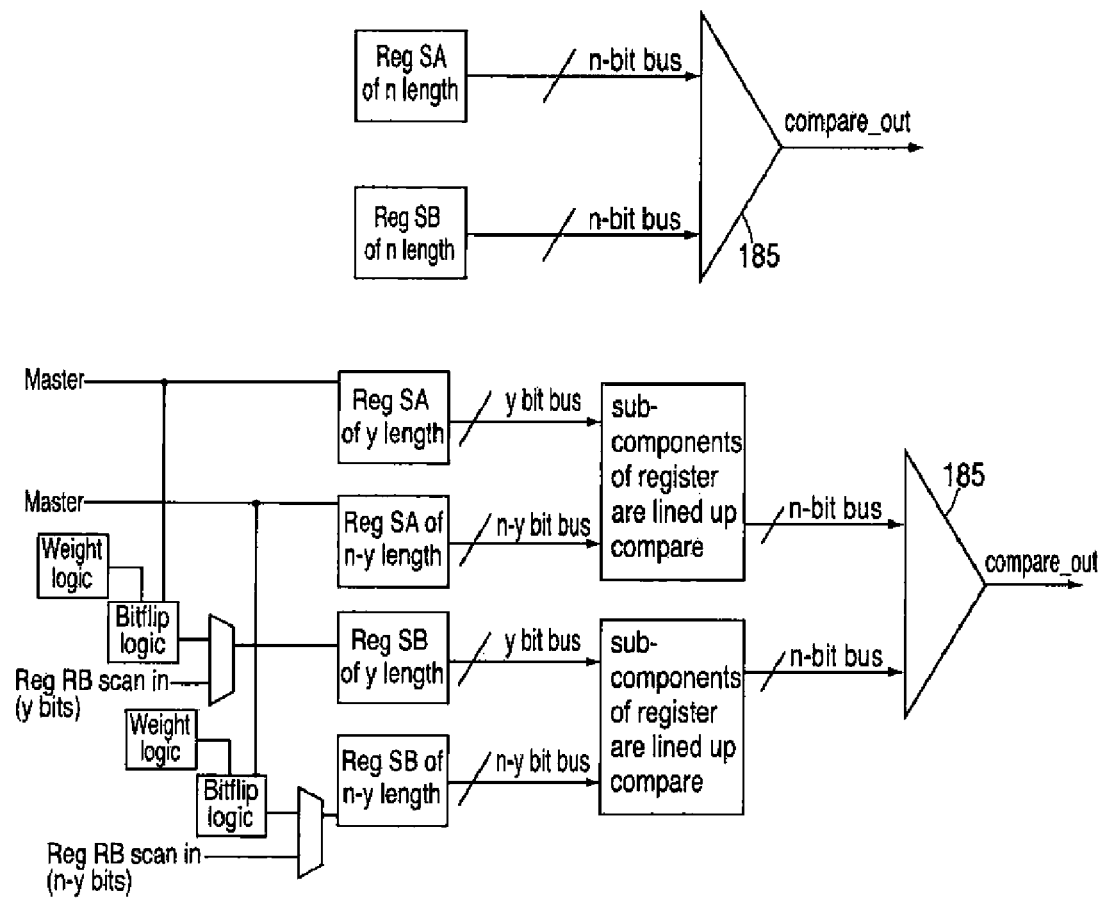
FIGS. 9A and 9B are block diagrams illustrating scan chains having multiple compare registers utilizing a splitting technique for weighting that can be implemented within embodiments of the present invention.
Figure 9B:
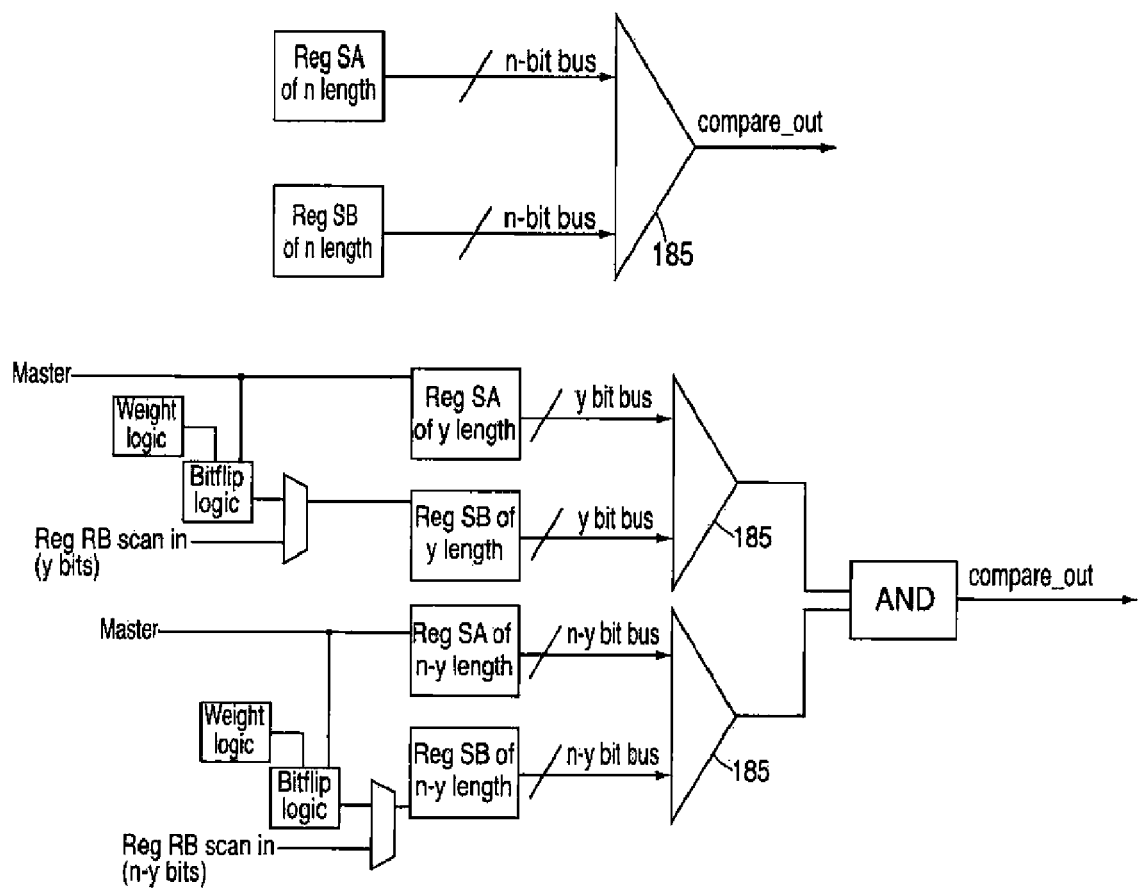

FIGS. 9A and 9B are block diagrams illustrating scan chains having multiple compare registers utilizing a splitting technique for weighting that can be implemented within embodiments of the present invention.

As shown in FIG. 9A, data bits from a plurality of registers SA and SB are compared via a comparator 185. In the current exemplary embodiment, the plurality of registers SA and SB are split to facilitate a more precise weighting. As shown in FIG. 9A, register SA is split into two subcomponents Register SA of y length and Register SA of n-y length. Also, Register SB is split into two subcomponents Register SB of y length and Register SB of n-y length. The data bits from the subcomponents of Register SA and the data bits of the subcomponents of Register SB are respectively combined together and the resultant data bits for each register SA and SB are then compared via a comparator 185.

In FIG. 9B, some of the features are the same as those shown in FIG. 9A, therefore, a description of these features has been omitted. Further, in FIG. 9B, another exemplary embodiment of the present invention, includes splitting the registers SA and SB into two subcomponents and comparing the respective subcomponents to each other via respective comparators 185 and combining outputs from the comparators 185 via an AND logic to provide a resulting output.

Figure 10A:
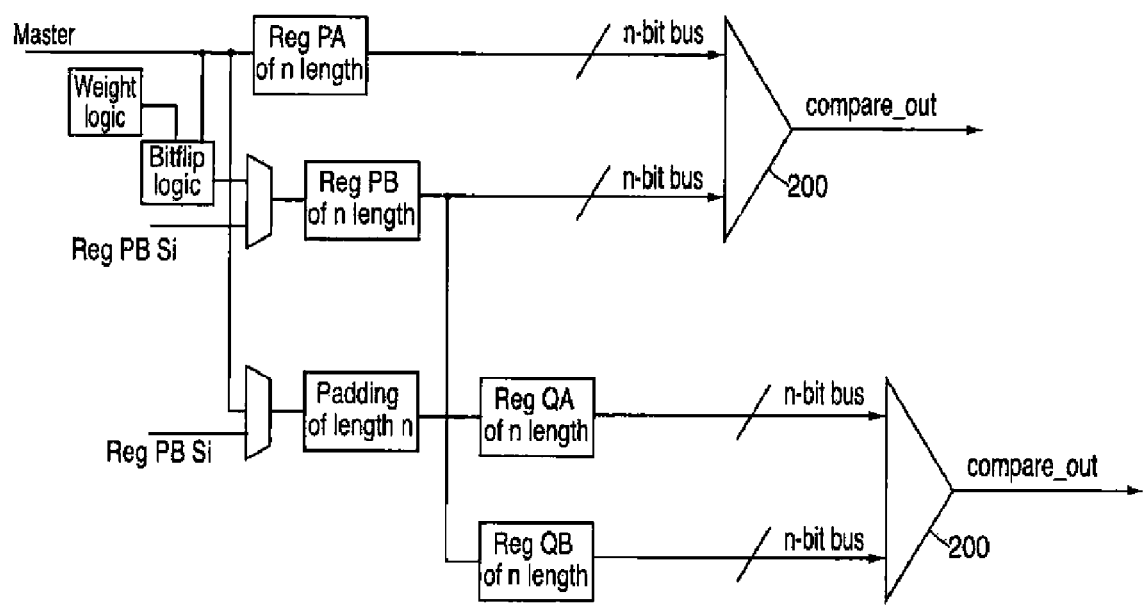
FIGS. 10A, 10B and 10C are block diagrams illustrating scan chains having multiple compare registers utilizing a padding technique that can be implemented within embodiments of the present invention.
Figure 10B:
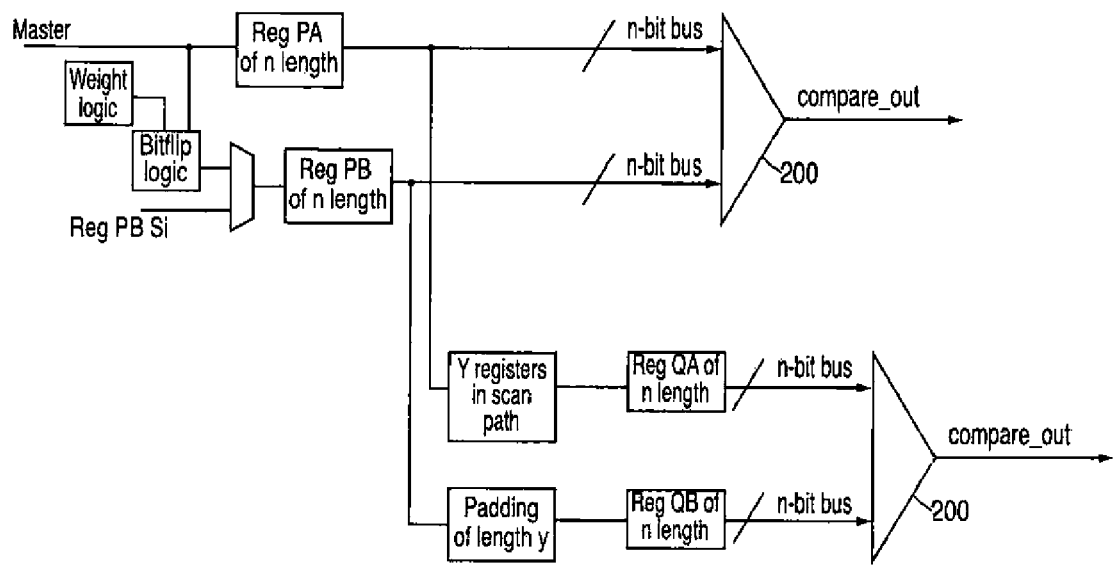
Figure 10C:
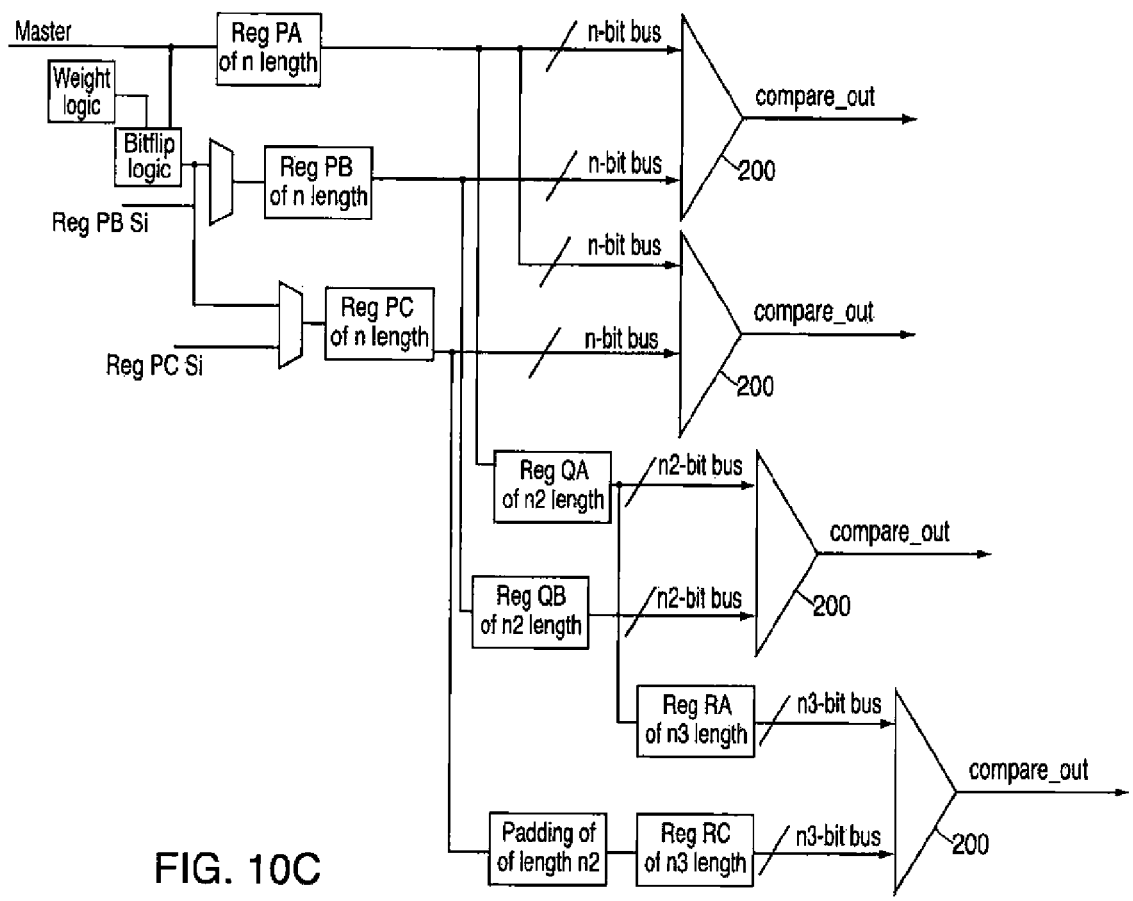

FIGS. 10A, 10B and 10C are block diagrams illustrating scan chains having multiple compare registers utilizing a padding technique that can be implemented within embodiments of the present invention. As shown in FIG. 10A, two registers PA and PB are being compared and two registered QA and QB are being compared. As shown in FIG. 10A, register QB is after Register PB in the scan chain, therefore, a length of n of register QA is padded in order to compare the data bits of the register QA with the corresponding data bits of register QB via a comparator 200. In FIGS. 10B and 10C, some of the features illustrated are the same as those of FIG. 10A, therefore a description thereof has been omitted.

Further, as shown in FIG. 10B, registers PA and PB are being compared and registers QA and QB are being compared. However, in the current exemplary embodiment, there are a number of Y registers in the scan path between PA and QA. Therefore, additional registers are required to be added before QB in order to provide padding of a length of y.

As shown in FIG. 10C, in addition to having registers PA, PB, QA and QB, there are also additional registers PC, RA and RC. As shown in FIG. 10C, registers PA and PB of a length of n are being compared via a comparator 200, registers PA and PC both of a length of n are being compared via a comparator 200, registers QA and QB both of a length of n2 are being compared via a comparator 200 and registers RA of a length of n3 and RC are being compared via a comparator 200. As shown in FIG. 10C, there is padding of a length of n2 required at register RC so that the register RC is lined up with register RA in the scan chain.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A test method for randomly testing logic structures, the method comprising:
   identifying and analyzing, by a computer, a function of a logic structure to be tested ;
   modifying the logic structure based on the identified function, the modifying comprising forcing noncritical logic to non-controlling states with respect to targeted paths of the logic structure;
   generating, by the computer, patterns to exercise the modified logic structure, the patterns generated randomly; and
   performing the identified function via the modified logic structure during random testing.

2. The test method of claim 1, wherein the paths are critical timing paths where a late timing mode timing slack is less than a predetermined margin.

3. The test method of claim 2, wherein the critical timing paths include a path from launching a latch through a longest combinatorial logic to a final latching point.

4. The test method of claim 1, wherein modifying the logic structure comprises:
   setting latches during a scan portion of the random test.

5. The test method of claim 4, wherein modifying the logic structure further comprises:
   setting latches such that noncritical paths of critical OR gates are set to a value of zero.

6. The test method of claim 4, wherein modifying the logic structure comprises:
   setting latches such that noncritical paths of critical AND gates are set to a value of one.

7. The test method of claim 4, wherein each of the latches receive non-random data.

8. The test method of claim 4, wherein each of the latches receive non-random data and the non-random data is loaded in parallel in one cycle to the latches after previous data has been scanned out of the latches.

9. A test method comprising:
   identifying, by a computer, a critical path which is to be activated during random testing;
   modifying a logic circuit based on the identified critical path, the modifying comprising forcing noncritical logic to non-controlling states with respect to targeted paths of the logic structure;
   generating, by the computer, patterns to exercise the modified logic circuit, the patterns generated randomly; and
   exercising the critical path via the modified logic circuit during random testing.

10. A method for providing improved random pattern testing of a logic structure including a plurality of registers, the method comprising:
- routing a parallel data path between plurality of registers;
- configuring a data manipulation logic within the parallel data path to be shared between the plurality of registers and inverting one or more data bits passing through the parallel data path; and
- configuring a plurality of select mechanisms to select a scan chain through which random data is to be sent to a respective register of the plurality of registers.

11. The method of claim 10, wherein the data manipulation logic is a bitflip logic unit.

12. The method of claim 10, wherein the plurality of registers are positioned such that output sides of a pair of registers are coupled to an input side of the select mechanisms corresponding to another pair of registers.

13. The method of claim 10, further comprising splitting the plurality of the registers into subcomponents of a predetermined length and inputting contents of the respective subcomponents into a logic structure for testing.

14. The method of claim 10, further comprising splitting each of the plurality of registers into first and second subcomponents of a predetermined length and inputting contents of the first subcomponent and the second subcomponent of each the registers into respective logic structures to be tested, and manipulating a result thereof.

15. The method of claim 10, further comprising:
- configuring a first pair of registers and a second pair of registers to be tested such that a second register of the second pair of registers is positioned after a second register of the first pair of registers in a scan chain; and
- padding a length of the first register of the second pair of registers to match a length of the second register of the second pair of registers.

16. The method of claim 10, further comprising:
- configuring a plurality of registers such that a register of a first pair of registers is followed by a register of a second pair of registers in respective scan chains; and
- padding a length of a register of the second pair of registers by adding a predetermined number of registers in the respective scan chain when a predetermined number of registers exist in the respective scan chain of the other register of the second pair of registers such that the length of the registers of the second pair of registers match one each other.

17. The method of claim 10, further comprising:
- configuring a plurality of registers to be tested such that each register is followed by a register of a pair of registers in respective scan chains; and
- padding a length of a register of a pair of registers to correspond to a predetermined length of the other register of the pair of registers.

18. A computer program product for random pattern testing of a logic structure, the computer program product comprising:
- a tangible storage medium readable by a processing circuit and storing instructions for execution by the processing circuit for performing a method comprising:
  - inverting one or more data bits passing through a parallel data path, the parallel data path shared between a plurality of registers; and
  - selecting a scan chain through which random data is to be sent to a respective register of the plurality of registers.

* * * * *